(12) United States Patent
Chen

(10) Patent No.: US 12,219,751 B2
(45) Date of Patent: Feb. 4, 2025

(54) SEMICONDUCTOR MEMORY DEVICE AND METHOD FOR FORMING THE SAME

(71) Applicant: Fujian Jinhua Integrated Circuit Co., Ltd., Quanzhou (CN)

(72) Inventor: Min-Teng Chen, Quanzhou (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 458 days.

(21) Appl. No.: 17/673,826

(22) Filed: Feb. 17, 2022

(65) Prior Publication Data

US 2023/0073903 A1 Mar. 9, 2023

(30) Foreign Application Priority Data

Sep. 8, 2021 (CN) .......................... 202111051859.1
Sep. 8, 2021 (CN) .......................... 202122168950.3

(51) Int. Cl.
*H10B 12/00* (2023.01)

(52) U.S. Cl.
CPC ......... *H10B 12/315* (2023.02); *H10B 12/033* (2023.02)

(58) Field of Classification Search
CPC ..... H10B 12/315; H10B 12/033; H01L 28/40; H01L 28/90
See application file for complete search history.

(56) References Cited

U.S. PATENT DOCUMENTS

| | | | |
|---|---|---|---|
| 10,497,773 B2 | 12/2019 | Chang et al. | |
| 2006/0138514 A1* | 6/2006 | Oh | H01L 28/56 257/306 |
| 2007/0236863 A1 | 10/2007 | Lee et al. | |
| 2009/0221127 A1* | 9/2009 | Iijima | H01L 21/0228 257/E21.011 |

\* cited by examiner

*Primary Examiner* — Elias Ullah
(74) *Attorney, Agent, or Firm* — Winston Hsu

(57) ABSTRACT

A semiconductor memory device includes a substrate and a capacitor. The capacitor is disposed on the substrate, and the capacitor includes a bottom electrode layer, a capacitor dielectric layer and a top electrode layer sequentially stacked from bottom to top and an aluminum-containing insulation layer. The aluminum-containing insulation layer includes aluminum titanium nitride or aluminum oxynitride, and is in direct contact with the capacitor dielectric layer and disposed between the bottom electrode layer and the top electrode layer. Therefore, the semiconductor memory device may effectively improve the leakage current.

11 Claims, 4 Drawing Sheets

SEMICONDUCTOR MEMORY DEVICE AND METHOD FOR FORMING THE SAME

BACKGROUND OF THE INVENTION

1. Field of the Invention

The present invention relates to a semiconductor memory device and a method for forming the same, and more particularly to a semiconductor memory device having a capacitor and a method for forming the same.

2. Description of the Prior Art

Semiconductor memory devices with capacitors are one of the necessary components in integrated circuits, which have the functions such as voltage adjustment and filtering. Generally, capacitors are divided into horizontal capacitors and vertical capacitors. The vertical capacitors are formed with a plurality of deep trenches filled with bottom electrode material in the substrate, and the plate area of the capacitor is provided through the side walls of the deep trenches, thereby reducing the occupied area of the capacitor in the integrated circuit and obtaining larger capacitance at the same time.

At present, the fabricating process of the vertical capacitor in the prior art generally includes the following steps: filling the deep trenches with bottom electrode material to form bottom electrodes, the bottom electrodes are connected to each other through a supporting layer, and then sequentially covering dielectric layers and top electrodes on the surface of the bottom electrodes to obtain a plurality of capacitors, wherein each capacitor is connected with each other through the supporting layer. However, with the decreasing size of devices, the design of capacitor components must meet the requirements of high integration and high density. Therefore, the semiconductor memory device needs to be further improved to effectively enhance the performance and reliability of capacitor components.

SUMMARY OF THE INVENTION

An object of the present invention is to provide a semiconductor memory device and a method for forming thereof, in which an aluminum-containing insulation layer which may be in direct contact with the capacitor dielectric layer is formed between the bottom electrode layer and the top electrode layer of the semiconductor memory device by additionally performing an oxygen getting treatment. Through the arrangement of the aluminum-containing insulation layer, the leakage current may be effectively improved and the decrease of capacitance may be avoided. Therefore, the present invention is allowable to provide a semiconductor memory device with better component reliability and improved efficiency, under simplified process flow.

To achieve the above objective, one embodiment of the present invention provides a semiconductor memory device, which includes a substrate and a capacitor. The capacitor is disposed on the substrate and includes a bottom electrode layer, a capacitor dielectric layer and a top electrode layer sequentially stacked from bottom to top, and an aluminum-containing insulation layer. The aluminum-containing insulation layer includes aluminum titanium nitride or aluminum oxynitride, and is in direct contact with the capacitor and located between the bottom electrode layer and the top electrode layer.

To achieve the above objective, one embodiment of the present invention provides a method for forming a semiconductor memory device, which includes the following steps. A substrate is provided, and a capacitor is formed on the substrate. The capacitor includes a bottom electrode layer, a capacitor dielectric layer and a top electrode layer sequentially stacked from bottom to top, and an aluminum-containing insulation layer. The aluminum-containing insulation layer includes aluminum titanium nitride or aluminum oxynitride, and is in direct contact with the capacitor and located between the bottom electrode layer and the top electrode layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2 and 3 are schematic diagrams showing a method for forming a semiconductor memory device in one preferred embodiment of the present invention; in which:

FIG. 2 is a schematic cross-sectional view of the semiconductor memory device of the present invention during an interface treatment; and FIG. 3 is a schematic cross-sectional view of the semiconductor memory device of the present invention after forming an aluminum-containing isolation layer.

DETAILED DESCRIPTION

For better understanding of the present invention, some embodiments of the present invention are listed below with the accompanying drawings, the composition and the desired effects of the present invention are described in detail for those skilled in the art. In addition, the technical features in different embodiments described in the following may be replaced, recombined, or mixed with one another to constitute another embodiment without departing from the spirit of the present disclosure.

Figure 1:
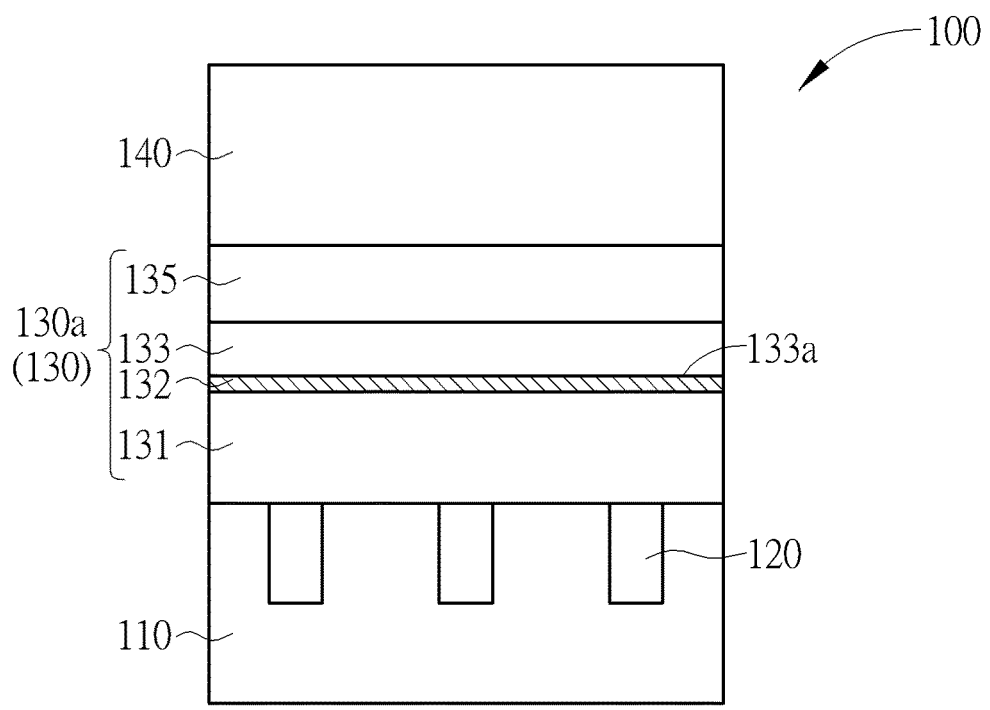
FIG. 1 is a schematic cross-sectional view of a semiconductor memory device according to a first embodiment of the present invention.

Please refer to FIG. 1, which is a schematic cross-sectional view of a semiconductor memory device 100 according to the first embodiment of the present invention. The semiconductor memory device 100 includes a substrate 110, such as a silicon substrate, a silicon-containing substrate (such as SiC, SiGe) or a silicon-on-insulator (SOI) substrate. At least one shallow trench isolation (STI) 120 is disposed in the substrate 110 to define a plurality of active areas (AA, not shown in the drawings) in the substrate 110, and further isolating a memory cell region (not shown in the drawing) of the semiconductor memory device 100 and a periphery region (not shown in the drawing) outside the semiconductor memory device 100. In one embodiment, the shallow trench isolation 120 is formed by, for example, firstly etching the substrate 110 to form a plurality of trenches (not shown in the drawing), and then filling the trenches with an insulating material (not shown in the drawing), such as, silicon oxide ($SiO_x$), silicon nitride (SiN) or silicon oxynitride (SiON), but not limited thereto.

The semiconductor memory device 100 further includes a capacitor 130 disposed above the substrate 110. In particular, the capacitor 130 includes at least one capacitor unit 130a, which may be electrically connected with a transistor (not shown) of the semiconductor memory device 100 through a storage node pad (SN pad, not shown) and a storage node contact (SNC, not shown) disposed below. Therefore, the capacitor unit 130a may be used as a storage node (SN), and form a minimum memory cell of the semiconductor memory device 100 with the transistor in the substrate 110 to receive voltage signals controlled by bit lines (BLs, not shown) and word lines (WLs, not shown). Specifically, the capacitor unit 130a includes a bottom electrode layer 131, a capacitor dielectric layer 133 and a top electrode layer 135 sequentially stacked as shown in FIG. 1. The top electrode layer 135 and the bottom electrode layer 131 for example include the same conductive material, such as tungsten (W), titanium (Ti), titanium nitride (TiN), tantalum (Ta), tantalum nitride (TaN) and aluminum (Al), preferably both including titanium nitride (TiN), but not limit thereto. The capacitor dielectric layer 133 includes, for example, a high-k dielectric material, such as hafnium oxide ($HfO_2$), hafnium silicon oxide ($HfSiO_4$), hafnium silicon oxynitride (HfSiON), zinc oxide ($ZrO_2$), titanium oxide ($TiO_2$), oxide-zirconium-oxide-aluminum-oxide-zirconium (ZAZ) or a combination thereof, preferably including oxide-zirconium-oxide-aluminum-oxide-zirconium, but not limited thereto.

It should be noted that the capacitor unit 130a of the present embodiment also includes an aluminum-containing insulation layer 132, which is disposed between the bottom electrode layer 131 and the top electrode layer 135 and is in direct contact with a bottom surface 133a of the capacitor dielectric layer 133. In one embodiment, the aluminum-containing insulation layer 132 is formed by, for example, an oxygen getting interface treatment to improve the leakage current of the capacitor unit 130a. Preferably, the aluminum-containing insulation layer 132 includes aluminum titanium nitride (AlTiN) and/or aluminum oxynitride (AlON), alternatively, the aluminum-containing insulation layer 132 may include a multilayer structure, for example including, an aluminum titanium nitride layer (not shown) and an aluminum oxynitride layer (not shown) sequentially stacked, but is not limited thereto. In addition, it should be easily understood by those of ordinary skill in the art that although the capacitor 130 in the present embodiment only includes a single capacitor unit 130a, the specific number and setting type of the capacitor units 130a are not limited thereto, but may be arbitrarily adjusted according to product requirements. For example, in another one embodiment, the capacitor may also include a plurality of capacitor units (not shown), or each capacitor unit may have other modes.

In addition, a semiconductor layer 140, a conductive layer (not shown), an insulation layer (not shown) may be further sequentially stacked on top of the capacitor 130 in order to integrally cover the entire capacitor 130. The semiconductor layer 140 includes semiconductor materials such as polysilicon or silicon germanium (SiGe), preferably boron-doped SiGe (B—SiGe). The conductive layer includes, for example, a metal material with low resistance such as tungsten or copper. The insulation layer includes, but not limited to, dielectric materials such as silicon oxide. In particular, the semiconductor layer 140 may directly cover and contact the capacitor units 130a disposed below, or further fill in the cavities (not shown) between the capacitor units, so as to protect the overall structure and the performance of the capacitor 130.

Therefore, the semiconductor memory device 100 according to the first embodiment of the present invention may capture oxygen and chlorine diffused in the bottom electrode layer 131 and/or the top electrode layer 135 by using the aluminum-containing isolation layer 132 additionally disposed between the capacitor dielectric layer 133 and the bottom electrode layer 131. Accordingly, the aluminum-containing insulation layer 132 may be capable of assisting the function of the capacitor dielectric layer 133, so as to further improve the leakage current of the capacitor unit 130a and avoid the decrease of the capacitance value. Therefore, the semiconductor memory device 100 may have components with better reliability, thereby improving the performance thereof.

In order to enable those skilled in the art to realize the present invention, the following further describes the method for forming the semiconductor memory device 100 of the present invention.

Figure 2:
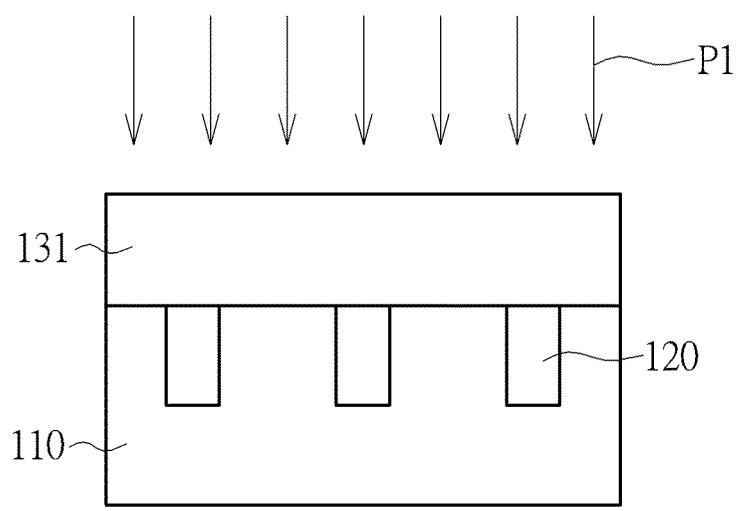
Figure 3:
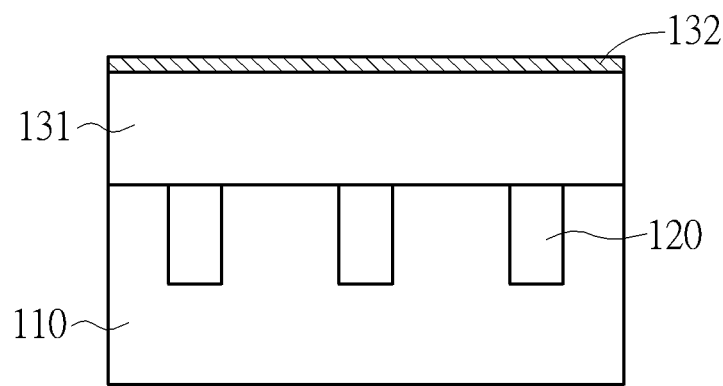

Please refer to FIG. 2 to FIG. 3, which are schematic diagrams of the semiconductor memory device 100 in different fabricating process steps according to the preferred embodiment of the present invention, respectively. First, as shown in FIG. 2, a substrate 110 is provided, and then a deposition and an etching process are performed to form a bottom electrode layer 131 on the substrate 110, the bottom electrode layer 131 includes, but not limited to, titanium nitride. Then, an oxygen getting treatment P1 is performed on the bottom electrode layer 131. In detail, during the oxygen getting treatment P1, the surface of the bottom electrode layer 131 is treated by components with oxygen getting capability, and oxygen and chlorine diffused in the bottom electrode layer 131 are thereby captured to prevent the oxygen and chlorine from diffusing in the bottom electrode layer 131 to affect the function of the semiconductor memory device 100. Preferably, the oxygen getting treatment P1 includes, for example, aluminum treatment, aluminum plasma treatment, aluminum species treatment or aluminum containing compound treatment, and which includes providing a gas with oxygen getting capability and aluminum, aluminum plasma, aluminum species or aluminum containing compounds for reaction. In detail, the aluminum, aluminum plasma, aluminum species or aluminum containing compounds may react with chlorine in the bottom electrode layer 131 to form aluminum chloride ($AlCl_3$), which may be volatilized at a high temperature (178° C.), and the aluminum, aluminum plasma, aluminum species or aluminum containing compounds may react with the oxygen in the bottom electrode layer 131 to form an oxygen bond, thereby forming the aluminum-containing insulation layer 132 containing aluminum titanium nitride and/or aluminum oxynitride on the surface of the bottom electrode layer 131, as shown in FIG. 3. It should be noted that, in one embodiment, when the oxygen getting treatment P1 is performed, aluminum, aluminum plasma, aluminum substance or aluminum-containing compound may be optionally provided first, and then the gas with oxygen getting capability may be provided, in this way, an aluminum titanium nitride layer (not shown) and an aluminum oxynitride layer (not shown) may be sequentially formed on the surface of the bottom electrode layer 131 to configured as the multilayer structure of the aluminum-containing insulation layer 132. However, in another one embodiment, the timing or the order of providing the aluminum, aluminum plasma, aluminum substance or aluminum-containing compound and the gas with oxygen getting capability may be adjusted to sequentially form the aluminum oxynitride layer (not shown) and the aluminum titanium nitride layer (not shown) on the surface of the bottom electrode layer 131.

It should also be noted that, in one preferred embodiment, a hydrogen treatment (not shown) may be optionally performed before the oxygen getting treatment P1, so as to inhibit the reaction rate of the subsequent oxygen getting treatment P1 occurred at the upper portion of the bottom electrode layer 131. Hence, the aluminum-containing insulation layer 132 is form with a relative lower formation rate, so as to form the aluminum-containing insulation layer 132 with more uniform thickness overall. Accordingly, the problem of uneven thickness of the aluminum-containing insulation layer 132 caused by the unsynchronized formation rate of the aluminum-containing insulation layer 132 in the upper half and the lower half due to the large aspect ratio of the capacitor unit 130a may be avoided.

In addition, it should be understood by those skilled in the art that although the aluminum-containing insulation layer 132 of the embodiment has a continuous film structure as shown in FIG. 1 or FIG. 3, the specific aspects are not limited thereto. As mentioned above, the formation of the aluminum-containing insulation layer 132 is accomplished by the reaction between the surface of the bottom electrode layer 131 (including TiN), the provided aluminum, aluminum plasma, aluminum substance or aluminum-containing compound, the gas with oxygen getting capability, and the oxygen diffused in the bottom electrode layer 131 on the surface of the bottom electrode layer 131 (including TiN). Therefore, when the oxygen is unevenly diffused in the bottom electrode layer 131, or the oxygen bond is unstably formed in a portion of the aluminum-containing insulation layer 132, a discontinuous film structure (not shown) may be formed. Accordingly, the aluminum-containing isolation layer 132 may not only effectively improve the leakage current of the capacitor unit 130a, but also effectively avoid the decrease of the capacitance value. Following these, the capacitor dielectric layer 133, the top electrode layer 135 and the semiconductor layer 140 may be subsequently formed on the aluminum-containing insulation layer 132, finally forming the semiconductor memory device 100 as shown in FIG. 1, to obtain better device reliability and good device performance correspondingly.

In addition, it should be easily understood by those skilled in the art that, the semiconductor memory device and its forming method of the present invention may have other types to meet the actual requirements, but not limited to the foregoing. For example, in one embodiment, the aforementioned oxygen getting treatment may also be performed after the formation of the capacitor dielectric layer 133 to form further aluminum-containing insulation layer to capture oxygen and chlorine diffused in the bottom electrode layer 131 and/or the top electrode layer 135. In another embodiment, the first oxygen getting treatment is performed after the formation of the bottom electrode layer 131 and before the formation of the capacitor dielectric layer 133 to form an aluminum-containing insulation layer, and then the second oxygen getting treatment is performed after the formation of the capacitor dielectric layer 133 and before the formation of the top electrode layer 135 to form another aluminum-containing insulation layer to capture oxygen and chlorine diffused in the bottom electrode layer 131 and/or the top electrode layer 135. Other embodiments or variations of the semiconductor memory device of the present invention will be further described below. To simplify the description, the follow description mainly focuses on the difference of each embodiment, and will not repeat the same. In addition, the same components in each embodiment of the present invention are labeled with the same reference numerals, so as to facilitate cross-reference among the embodiments.

Figure 4:
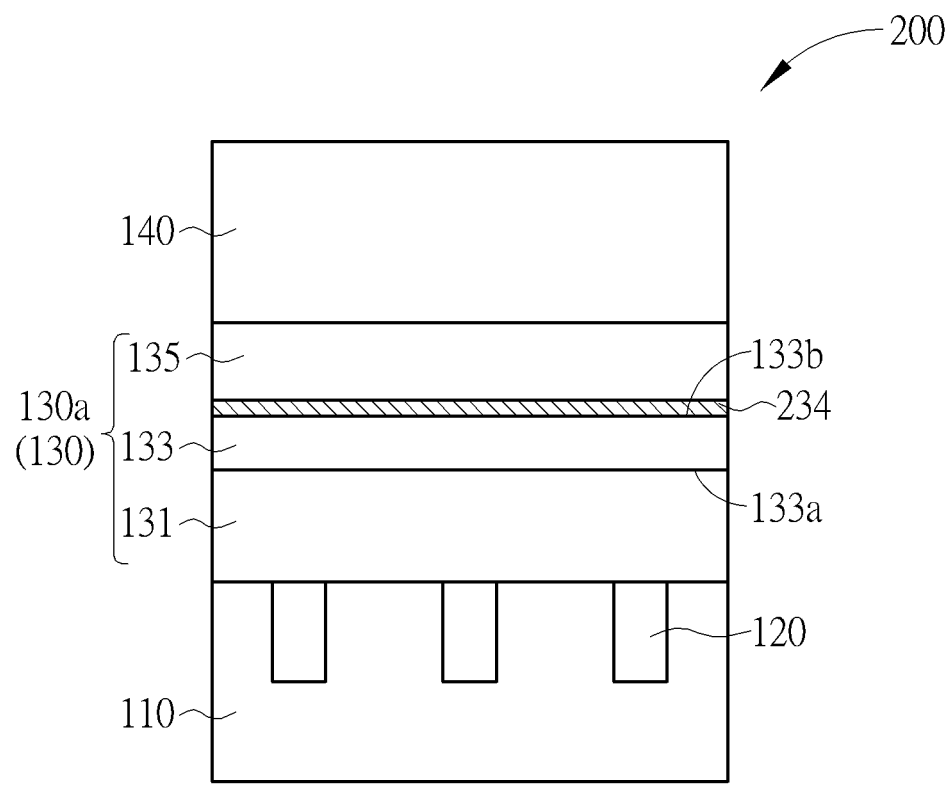
FIG. 4 is a schematic cross-sectional view of a semiconductor memory device according to a second embodiment of the present invention.

Please refer to FIG. 4, which shows a schematic cross-sectional view of a semiconductor memory device 200 according to a second embodiment of the present invention. The structure of the semiconductor memory device 200 of the second embodiment is substantially the same as that of the semiconductor memory device 100 of the first embodiment, including the substrate 110, the capacitor 130, the semiconductor layer 140, etc., which will not be repeated here. The main difference between the second embodiment and the aforementioned first embodiment is that the aluminum-containing insulation layer 234 of the second embodiment is disposed between the capacitor dielectric layer 133 and the top electrode layer 135, and is in direct contact with the top surface 133b of the capacitor dielectric layer 133.

Specifically, the method for forming the aluminum-containing insulation layer 234 is the same as that for forming the aluminum-containing insulation layer 132 of the first embodiment, and the aluminum-containing insulation layer 234 may also improve the leakage current of the capacitor unit 130a. Preferably, the aluminum-containing insulation layer 234 may also include aluminum titanium nitride and/or aluminum oxynitride, alternatively, the aluminum-containing insulation layer 234 may also include a multilayer structure, for example, an aluminum titanium nitride layer (not shown) and an aluminum oxynitride layer (not shown) sequentially stacked, but not limited thereto.

Therefore, the semiconductor memory device 200 in the second embodiment of the present invention may also utilizes the aluminum-containing insulation layer 234 additionally disposed between the capacitor dielectric layer 133 and the top electrode layer 135 to capture oxygen and chlorine diffused in the bottom electrode layer 131 and/or the top electrode layer 135, to form oxygen-containing bonds. Therefore, the aluminum-containing insulation layer 234 may also support the function of the capacitor dielectric layer 133 to further improve the leakage current of the capacitor unit 130a. Accordingly, the semiconductor memory device 200 may therefore obtain components with better reliability, to improve its performance.

Figure 5:
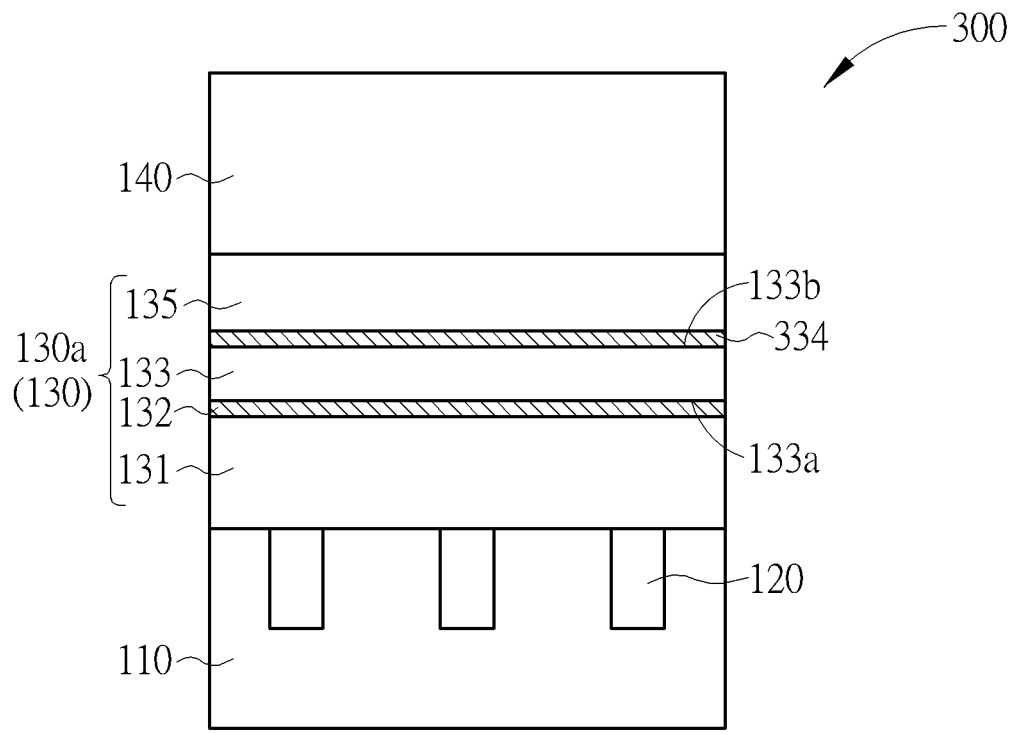
FIG. 5 is a schematic cross-sectional view of a semiconductor memory device according to a third embodiment of the present invention.

Please refer to FIG. 5, which shows a schematic cross-sectional view of a semiconductor memory device 300 according to a third embodiment of the present invention. The structure of the semiconductor memory device 300 of the third embodiment is substantially the same as that of the semiconductor memory device 100 of the first embodiment, including the substrate 110, the capacitor 130, the semiconductor layer 140, etc., which will not be repeated here. The main difference between the third embodiment and the aforementioned first embodiment is that another aluminum-containing insulation layer 334 is additionally disposed in the present embodiment, and the aluminum-containing insulation layer 132 and the another aluminum-containing insulation layer 334 are both disposed between the bottom electrode layer 131 and the top electrode layer 135, to directly contact the bottom surface 133a and the top surface 133b of the capacitor dielectric layer 133 respectively.

Specifically, the method for forming the another aluminum-containing insulation layer 334 is similar to such as the aluminum-containing insulation layer 132 of the first embodiment described above, to further improve the leakage current of the capacitor unit 130a. The aluminum-containing insulation layer 132 is disposed between the bottom electrode layer 131 and the capacitor dielectric layer 133 to directly contact the bottom surface 133a of the capacitor dielectric layer 133. The another aluminum-containing insulation layer 334 is disposed between the capacitor dielectric layer 133 and the top electrode layer 135 to directly contact the top surface 133b of the capacitor dielectric layer 133. In one embodiment, the material of the another aluminum-containing insulation layer 334 may be the same or different from the material of the aluminum-containing insulation layer 132, for example, the another aluminum-containing insulation layer 334 may also include aluminum titanium nitride and/or aluminum oxynitride, or aluminum titanium nitride layer (not shown) and aluminum oxynitride layer (not shown) sequentially stacked, but not limited thereto.

Therefore, the semiconductor memory device 300 of the third embodiment of the present invention may further capture oxygen and chlorine diffused in the bottom electrode layer 131 and/or the top electrode layer 135, and form oxygen-containing bonds by using the two aluminum-containing insulation layers (namely, the aluminum-containing insulation layer 132 and the another aluminum-containing insulation layer 334) disposed between the bottom electrode layer 133 and the top electrode layer 135. Therefore, the aluminum-containing insulation layer 132 and the another aluminum-containing insulation layer 334 may further support the function of the capacitor dielectric layer 133, and effectively improve the leakage current of the capacitor unit 130a. Accordingly, the semiconductor memory device 300 may have components with better reliability, so as to improve its performance.

Figure 6:
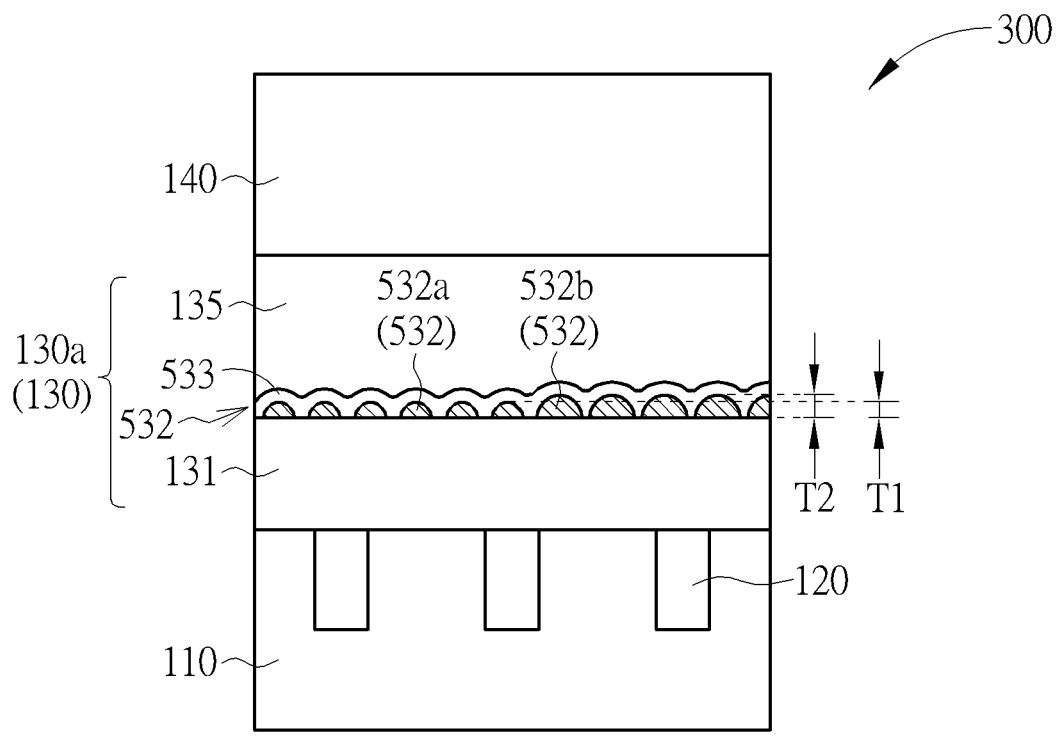
FIG. 6 is a schematic cross-sectional view of a semiconductor memory device according to a fourth embodiment of the present invention.

Please refer to FIG. 6, which shows a schematic cross-sectional view of a semiconductor memory device 500 according to a fourth embodiment of the present invention. The structure of the semiconductor memory device 500 of the fourth embodiment is substantially the same as that of the semiconductor memory device 100 of the first embodiment, including the substrate 110, the capacitor 130, the semiconductor layer 140, etc., which will not be repeated here. The main difference between the fourth embodiment and the aforementioned first embodiment is that an aluminum-containing insulation layer 532 of the fourth embodiment has a discontinuous film structure.

Specifically, the aluminum-containing insulation layer 532 is disposed between such as the bottom electrode layer 131 and the capacitor dielectric layer 133, and its forming method is similar to such as the aluminum-containing insulation layer 132 of the first embodiment to further improve the leakage current of the capacitor unit 130a. It should be noted that when the aluminum-containing insulation layer 532 is formed, due to the uneven distribution of oxygen diffused in the bottom electrode layer 131 or the formation of unstable oxygen bonds, a plurality of arc-shaped protrusions 532a and 532b separated from each other are formed, the aluminum-containing insulation layer 532 may thereby obtain a discontinuous film structure generally, as shown in FIG. 6. In the present embodiment, the arc-shaped protrusions 532a and 532b of the aluminum-containing insulation layer 532 respectively have a first thickness T1 and a second thickness T2 different from the first thickness T1, but not limited thereto. In another embodiment, the plurality of arc-shaped protrusions of the aluminum-containing insulation layer 532 may also have the same thickness (not shown), for example, the thickness T1 or the thickness T2. On the other hand, a capacitor dielectric layer 533 disposed above the aluminum-containing isolation layer 532 may form a wave shape accordingly, as shown in FIG. 6. Therefore, the aluminum-containing insulation layer 532 with discontinuous film structure may support the function of the capacitor dielectric layer 533, which may not only effectively improve the leakage current problem of the capacitor 130a, but also effectively avoid the decrease of the capacitance value. Therefore, the semiconductor memory device 500 may have components with better reliability, so as to improve its performance.

In addition, in the fourth embodiment, although the aluminum-containing isolation layer 532 having a discontinuous film structure is located between the bottom electrode layer 131 and the capacitor dielectric layer 533, in another embodiment, an aluminum-containing isolation layer (not shown) having a discontinuous film structure may be disposed between the capacitor dielectric layer 533 and the top electrode layer 135, or formed between the bottom electrode layer 131 and the capacitor dielectric layer 533 and between the capacitor dielectric layer 533 and the top electrode layer 135 simultaneously, so as to capture the oxygen and chlorine diffused in the bottom electrode layer 131 and/or the top electrode layer 135, and avoid the decrease of the capacitance value, thereby effectively improving the leakage current of the capacitor unit 130a.

Figure 7:
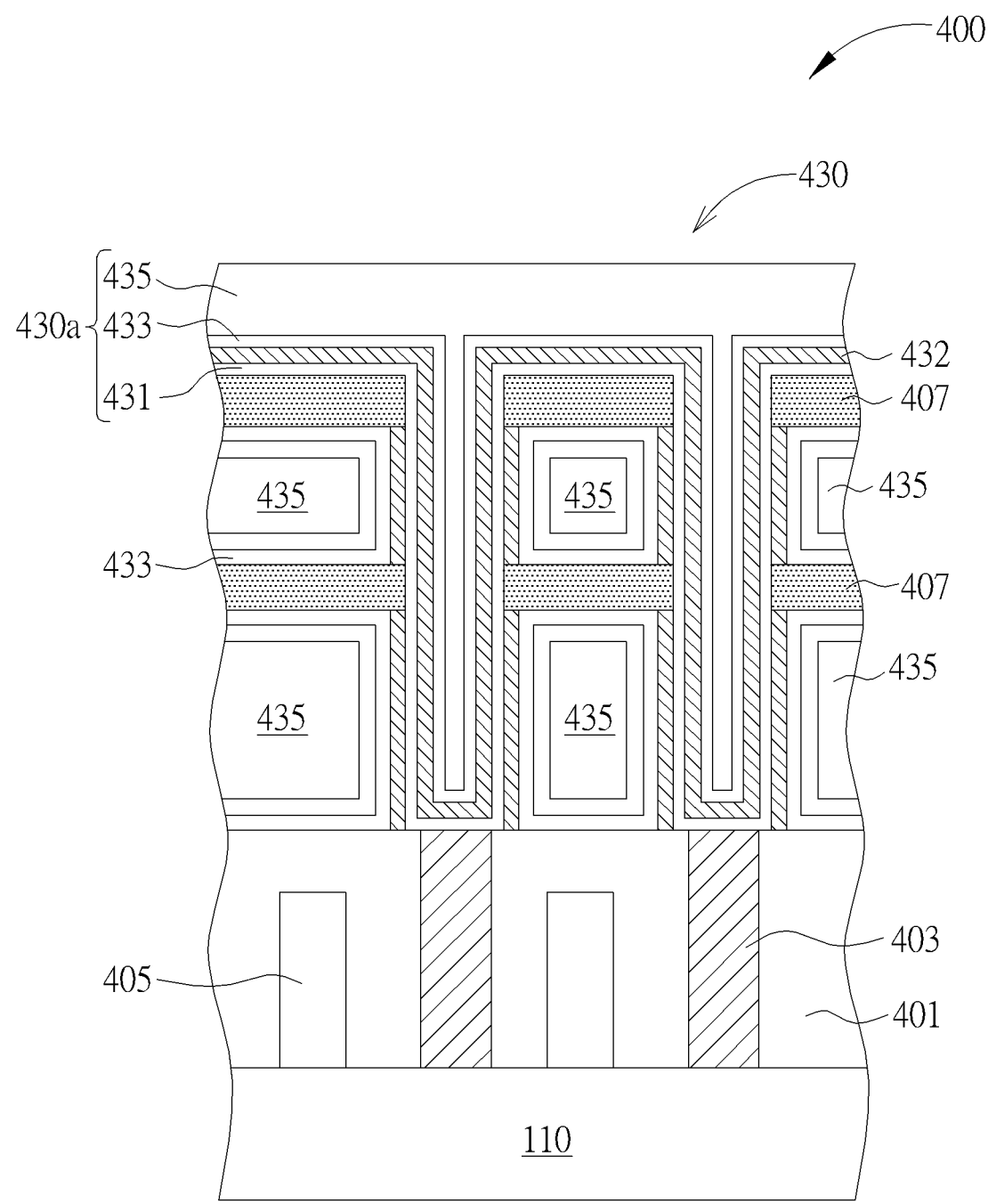
FIG. 7 is a schematic diagram of a semiconductor memory device according to one preferred embodiment of the present invention.

Please refer to FIG. 7, which shows a schematic diagram of a semiconductor memory device according to one preferred embodiment of the present invention. In the present embodiment, the semiconductor memory device 400 is, for example, a dynamic random access memory (DRAM) device, including a substrate 110. In addition, a plurality of word lines (not shown) may be formed in the substrate 110, preferably buried word lines (BWLs) embedded in the substrate 110, but not limited thereto.

The semiconductor memory device 400 further includes a plurality of contact structures 403 and a plurality of bit lines 405 disposed on the substrate 110. In particular, the contact structure 403 and the bit line 405 are formed in a dielectric layer 401 above the substrate 110, and the dielectric layer 401 includes such as silicon nitride (SiN), but not limited thereto. Specifically, each of the contact structures 403 includes storage node pads and storage node plugs sequentially stacked from top to bottom, and may be electrically connected with transistor components (not shown) embedded in the substrate 110. Each of the bit lines 405 is also electrically connected with the transistor components through a bit line contact (BLC, not shown) formed below, as shown in FIG. 7.

The semiconductor memory device 400 further includes a capacitor 430 disposed above the contact structures 403 and the bit lines 405. The capacitor 430 further includes a bottom electrode layer 431, a capacitor dielectric layer 433 and a top electrode layer 435 sequentially stacked. In particular, the materials of the bottom electrode layer 431, the capacitor dielectric layer 433 and the top electrode layer 435 is substantially the same as that of the previous embodiment, and will not be repeated here. In the present embodiment, the bottom electrode layer 431 conformally covers a top surface and inner surfaces of a trench (not shown) to provide structural support through support layers 407 disposed on both sides of the trench, the capacitor dielectric layer 433 conformally forms on the bottom electrode layer 431, and the top electrode layer 435 forms on the capacitor dielectric layer 433 and fills the trench. Therefore, the bottom electrode layer 431, the capacitor dielectric layer 433 and the top electrode layer 435 sequentially stacked may form a plurality of capacitor units 430a, which are electrically connected with the contact structures 403 below, respectively, as shown in FIG. 7.

It should be noted that the capacitor 430a further includes an aluminum-containing insulation layer 432, which is disposed between the bottom electrode layer 431 and the capacitor dielectric layer 433. In particular, the aluminum-containing insulation layer 432, for example, is the same as that described in the previous embodiment, and will not be described in detail here. Preferably, the aluminum-containing insulation layer 432 may include aluminum titanium nitride and/or aluminum oxynitride, or the aluminum-containing insulation layer 432 may include a composite layer structure, for example, an aluminum titanium nitride layer (not shown) and an aluminum oxynitride layer (not shown) sequentially stacked, but not limited thereto. Therefore, the semiconductor memory device 400 may capture oxygen and chlorine diffused in the bottom electrode layer 431 and/or the top electrode layer 435, and form oxygen bonds by using the additional aluminum-containing insulation layer 432. Accordingly, the aluminum-containing insulation layer 432 may support the function of the capacitor dielectric layer 433 to further improve the leakage current of the capacitor 430a and avoid the decrease of the capacitance value. Therefore, the semiconductor memory device 400 may have components with better reliability, thereby improving its performance.

Generally, at least one oxygen getting treatment is additionally performed either before or after the formation of the capacitor dielectric layer during the formation of the capacitor, with gas with oxygen getting capability, aluminum, aluminum plasma, aluminum substance or aluminum-containing compound being provided to capture the oxygen and chlorine diffused in the bottom electrode layer and/or the top electrode layer to form volatile aluminum chloride and aluminum-containing insulation layers containing aluminum titanium nitride and/or aluminum oxynitride, respectively. In particular, the aluminum-containing insulation may include a multilayer structure and/or a discontinuous film structure, but not limited thereto. Therefore, the capacitor may additionally include an aluminum-containing isolation layer which is disposed between the bottom electrode layer and the top electrode layer and is in direct contact with the capacitor dielectric layer. In detail, the oxygen getting treatment may be optionally performed after the formation of the bottom electrode layer and before the formation of the capacitor dielectric layer, the aluminum-containing isolation layer may thereby be disposed between the capacitor dielectric layer and the bottom electrode layer and directly contact the bottom surface of the capacitor dielectric layer. Alternatively, the oxygen getting treatment may also be performed after the formation of the capacitor dielectric layer and before the formation of the top electrode layer, the aluminum-containing isolation layer may thereby be disposed between the capacitor dielectric layer and the top electrode layer, and directly contact the top surface of the capacitor dielectric layer. In addition, according to the actual requirements, two or more oxygen getting treatments may be performed, namely, the first oxygen getting treatment is performed after the formation of the bottom electrode layer and before the formation of the capacitor dielectric layer, and then the second oxygen getting treatment is performed after the formation of the capacitor dielectric layer and before the formation of the top electrode layer, so as to form two aluminum-containing insulation layers respectively contacting the bottom surface and the top surface of the capacitor dielectric layer. Therefore, not only may the leakage current of the capacitor be effectively improved, but also the decrease of the capacitance value may be avoided simultaneously, thereby improving the component reliability of the semiconductor memory device and enhancing the component efficiency.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory device, comprising:
   a substrate; and
   a capacitor, disposed on the substrate, and comprising:
      a bottom electrode layer, a capacitor dielectric layer and a top electrode layer sequentially stacked from bottom to top; and
      an aluminum-containing insulation layer, comprising aluminum titanium nitride or aluminum oxynitride, wherein the aluminum-containing insulation layer is in direct contact with the capacitor dielectric layer and is disposed between the bottom electrode layer and the top electrode layer, wherein the aluminum-containing insulation layer comprises a plurality of arc-shaped protrusions separated from each other, and exhibits a discontinuous film structure, and the arc-shaped protrusions respectively have first thickness and a second thicknesses different from the first thickness.

2. The semiconductor memory device of claim 1, wherein the aluminum-containing insulation layer is disposed between the capacitor dielectric layer and the bottom electrode layer and is in direct contact with a bottom surface of the capacitor dielectric layer.

3. The semiconductor memory device of claim 1, wherein the aluminum-containing insulation layer is disposed between the capacitor dielectric layer and the top electrode layer and is in direct contact with a top surface of the capacitor dielectric layer.

4. The semiconductor memory device of claim 1, wherein the aluminum-containing insulation layer comprises an aluminum titanium nitride layer and an aluminum oxynitride layer, and the aluminum titanium nitride layer and the aluminum oxynitride layer are sequentially stacked from bottom to top.

5. The semiconductor memory device of claim 1, further comprising:
   another aluminum-containing insulation layer, the another aluminum-containing insulation layer being also in direct contact with the capacitor dielectric layer and located between the bottom electrode layer and the top electrode layer, wherein the aluminum-containing insulation layer and the another aluminum-containing insulation layer are in direct contact with a bottom surface and a top surface of the capacitor dielectric layer respectively.

6. The semiconductor memory device of claim 1, wherein the capacitor dielectric layer comprises a high-k dielectric material, the high-k dielectric material is selected from the group consisting of hafnium oxide, hafnium silicon oxide, hafnium silicon oxynitride, zinc oxide, titanium oxide and zirconium oxide-aluminium oxide-zirconium oxide.

7. A semiconductor memory device, comprising:
a substrate; and
a capacitor, disposed on the substrate, and comprising:
- a bottom electrode layer, a capacitor dielectric layer and a top electrode layer sequentially stacked from bottom to top; and
- an aluminum-containing insulation layer, comprising aluminum titanium nitride or aluminum oxynitride, wherein the aluminum-containing insulation layer is in direct contact with the capacitor dielectric layer and is disposed between the bottom electrode layer and the top electrode layer, wherein the aluminum-containing insulation layer comprises a plurality of arc-shaped protrusions separated from each other, and a portion of the capacitor dielectric layer is sandwiched between the arc-shaped protrusions.

8. The semiconductor memory device of claim 7, wherein the aluminum-containing insulation layer is disposed between the capacitor dielectric layer and the bottom electrode layer and is in direct contact with a bottom surface of the capacitor dielectric layer.

9. The semiconductor memory device of claim 7, wherein the aluminum-containing insulation layer is disposed between the capacitor dielectric layer and the top electrode layer and is in direct contact with a top surface of the capacitor dielectric layer.

10. The semiconductor memory device of claim 9, wherein the aluminum-containing insulation layer is disposed between the capacitor dielectric layer and the top electrode layer and is in direct contact with a top surface of the capacitor dielectric layer.

11. A semiconductor memory device, comprising:
a substrate; and
a capacitor, disposed on the substrate, and comprising:
- a bottom electrode layer, a capacitor dielectric layer and a top electrode layer sequentially stacked from bottom to top; and
- an aluminum-containing insulation layer, comprising aluminum titanium nitride or aluminum oxynitride, wherein the aluminum-containing insulation layer is in direct contact with the capacitor dielectric layer and is disposed between the bottom electrode layer and the top electrode layer, wherein the aluminum-containing insulation layer comprises a discontinuous film structure.

* * * * *